United States Patent
Jain et al.

(10) Patent No.: US 8,743,647 B2
(45) Date of Patent: Jun. 3, 2014

(54) STATIC READ ONLY MEMORY DEVICE WHICH CONSUMES LOW STAND-BY LEAKAGE CURRENT

(75) Inventors: Sanjiv Kumar Jain, Ghaziabad (IN); Vikas Gadi, Ghaziabad (IN)

(73) Assignee: Synopsys, Inc., Mountain View, CA (US)

( * ) Notice: Subject to any disclaimer, the term of this patent is extended or adjusted under 35 U.S.C. 154(b) by 143 days.

(21) Appl. No.: 13/401,830

(22) Filed: Feb. 21, 2012

(65) Prior Publication Data

US 2013/0219200 A1 Aug. 22, 2013

(51) Int. Cl.
*G11C 7/00* (2006.01)

(52) U.S. Cl.
USPC ....... 365/226; 365/156; 365/154; 365/189.09

(58) Field of Classification Search
USPC .............................. 365/226, 156, 154, 189.09
See application file for complete search history.

(56) References Cited

U.S. PATENT DOCUMENTS

| | | | |
|---|---|---|---|
| 6,985,380 B2 * | 1/2006 | Khellah et al. ................ | 365/156 |
| 7,755,147 B2 * | 7/2010 | Satoh ............................ | 257/371 |
| 8,406,041 B2 * | 3/2013 | Shukh ........................... | 365/158 |
| 8,411,494 B2 * | 4/2013 | Shukh ........................... | 365/158 |
| 2011/0007596 A1 | 1/2011 | Lee et al. | |

FOREIGN PATENT DOCUMENTS

EP 0928006 3/2004

OTHER PUBLICATIONS

Kawaguchi, Hiroshi et al., Institute of Industrial Science, University of Tokyo, "Dynamic Leakage Cut-off Scheme for Low-Voltage SRAM's", IEEE 1998 Symposium on VLSI Circuits Digest of Technical Papers, pp. 140-141.

* cited by examiner

*Primary Examiner* — Connie Yoha
(74) *Attorney, Agent, or Firm* — Baker Botts L.L.P.

(57) ABSTRACT

An electronic device comprises a semiconductor memory cell having a bistable bit storage circuit having first and second power contact points. A first switch is coupled to the first power contact point to receive a first voltage. A second switch coupled to the second power contact point to receive a second voltage. Circuitry is provided for turning off the first and second switches to decouple the respective first and second voltages from the respective first and second power contact points, during stand-by operation of the electronic device.

19 Claims, 3 Drawing Sheets

STATIC READ ONLY MEMORY DEVICE WHICH CONSUMES LOW STAND-BY LEAKAGE CURRENT

TECHNICAL FIELD

The present subject matter generally relates to the field of electronic devices that incorporate semiconductor integrated circuits. The disclosure pertains to semiconductor design and fabrication, and to power consumption.

BACKGROUND

Solid state semiconductor devices consume power within its operational circuitry when operating, and also when they are in an idle or stand-by state. Many applications of such semiconductor devices, for example mobile and biomedical applications, operate stand-alone or without readily available power, so it is desirable to minimize such power consumption.

This is particularly true for integrated circuits which contain significant amounts of memory. A semiconductor memory subsystem can be divided into two regions: One region is an array of storage cells, typically organized as a two-dimensional array of memory bit cells, where individual cells are accessible using addressable cell access lines or busses. The other region is an arrangement of logic devices, whose purpose may include supporting the cell array. For instance, many System on Chip (SoC) devices contain large arrays of such memory cells. The memory subsystem constitutes a major part (typically up to 70%) of the silicon area for a typical SoC device.

In a memory device having an array of cells, the device consumes power for each cell. Therefore, due to factors of heat generation and dissipation, and efficiency of operation, power consumption is a noteworthy design consideration.

SUMMARY

An electronic device comprises a semiconductor memory cell having a bistable bit storage circuit having first and second power contact points. A first switch is coupled to the first power contact point to receive a first voltage. A second switch coupled to the second power contact point to receive a second voltage. Circuitry is provided for turning off the first and second switches to decouple the respective first and second voltages from the respective first and second power contact points, during stand-by operation of the electronic device.

Further features and advantages of embodiments of the present disclosure, as well as the structure and operation of preferred embodiments of the present disclosure, are described in detail below with reference to the accompanying exemplary drawings.

BRIEF DESCRIPTION OF THE VIEWS OF DRAWINGS

Figure 1:
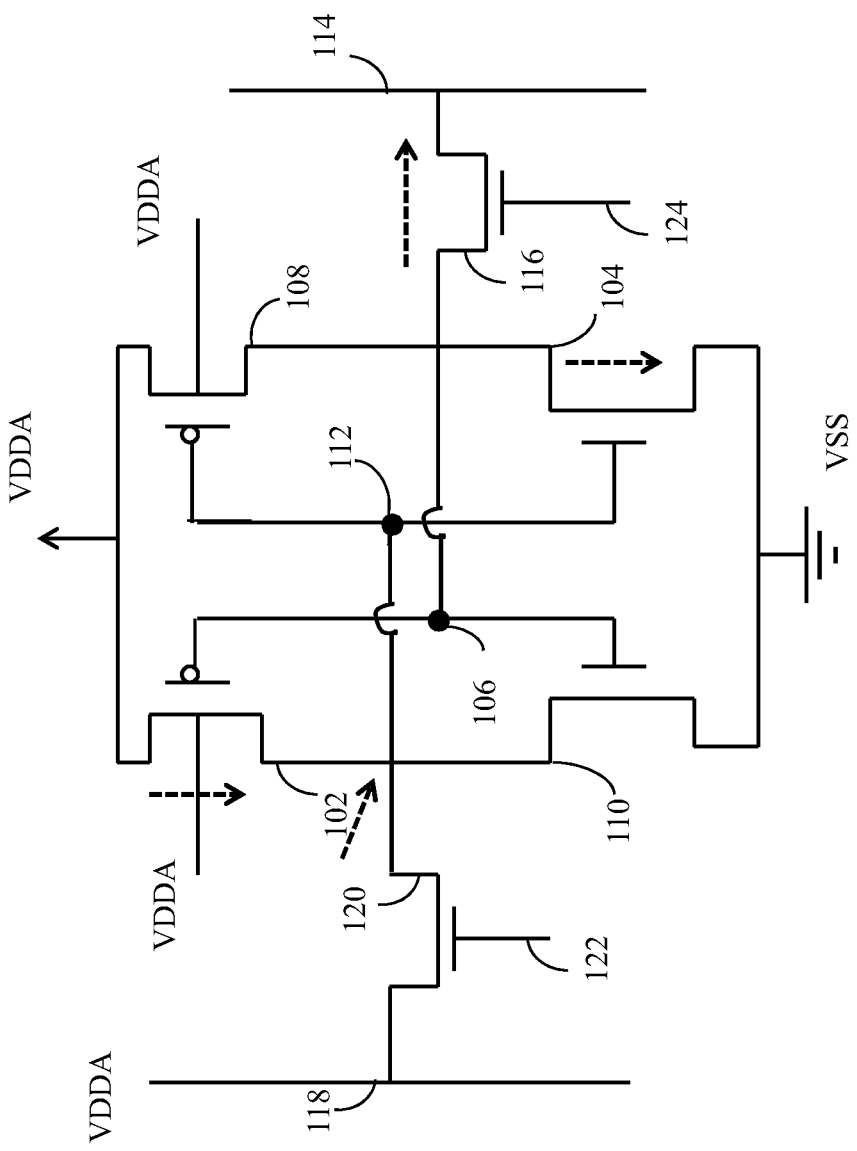
Figure 2:
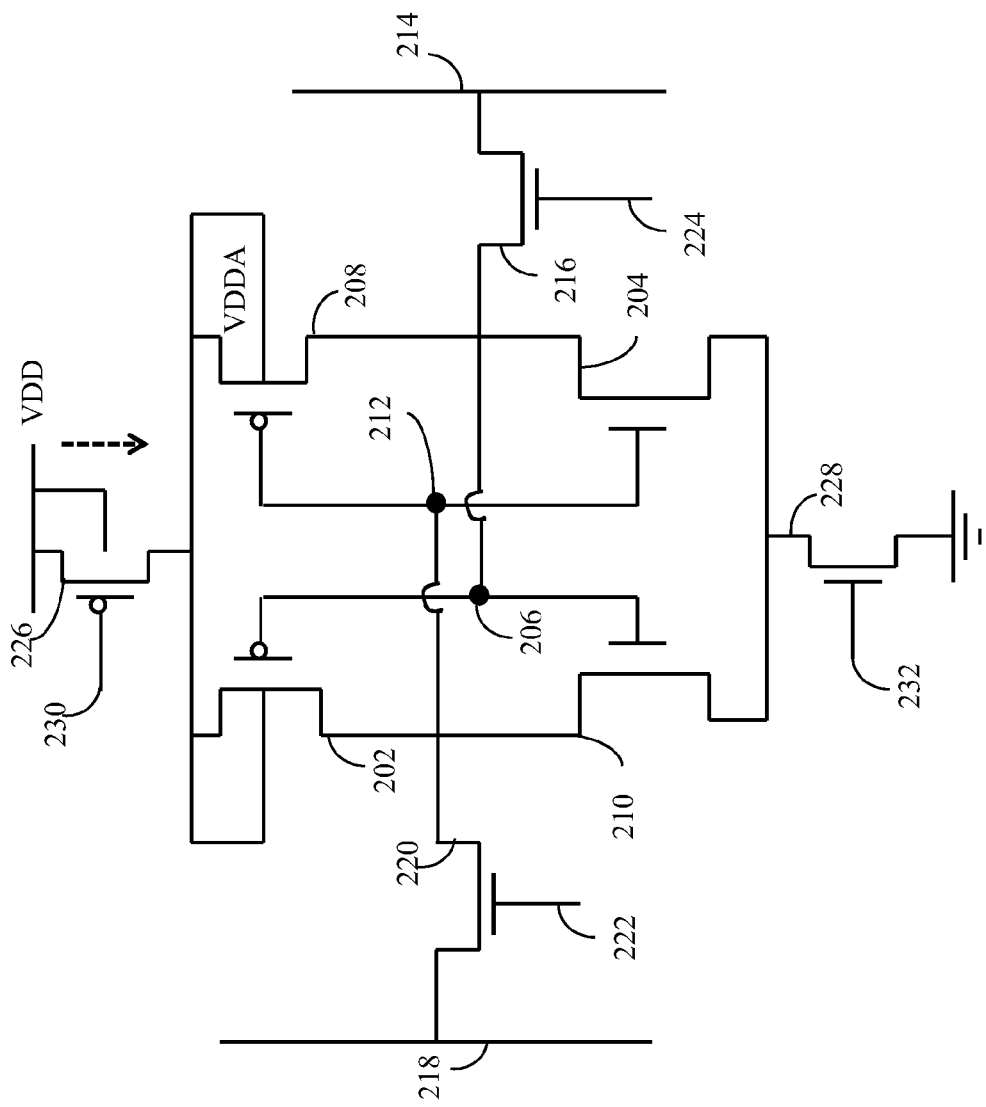
Figure 3:
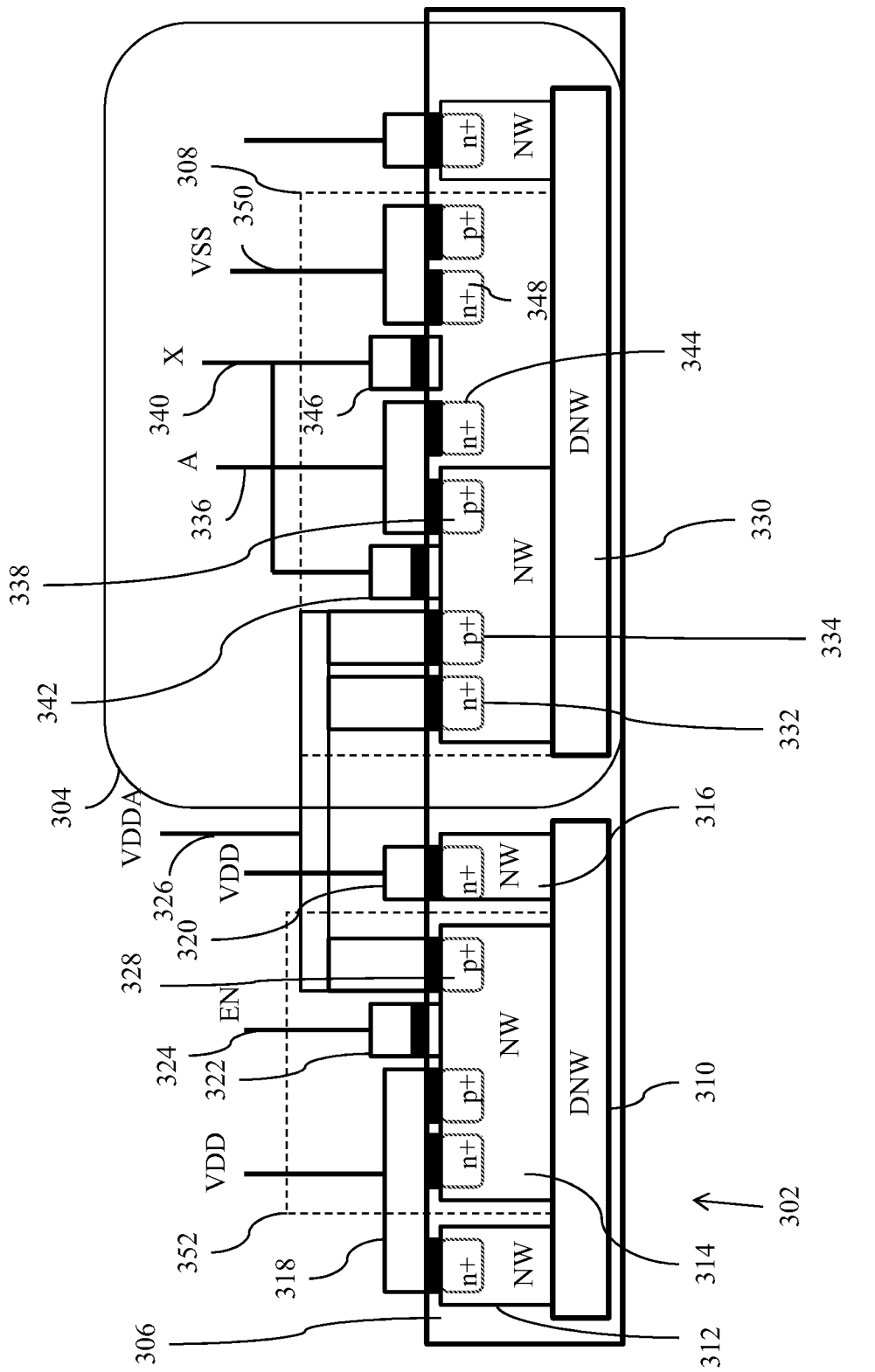

FIG. 1 is a schematic diagram of a prior art memory cell;
FIG. 2 is a schematic diagram of a memory cell according to an embodiment of the present disclosure; and
FIG. 3 is a cross-sectional diagram showing fabrication of an embodiment in semiconductor technology.

DETAILED DESCRIPTION OF THE EMBODIMENTS

In general, semiconductor and other electronic devices consume a certain amount of current when powered up at any time. The subject matter disclosed herein concerns both current consumption and power consumption. Current flow generates heat, which generally must be dissipated in a way that does not detract from use and operation of devices. Also, the power consumption is a factor, when designers determine which type of semiconductor technology to use in circuit implementations. For instance, it is well-known that CMOS switching circuits consume negligible power except when they are in the act of switching states, so a designer can choose CMOS technology for electronic devices requiring low power consumption.

Another technique for reducing current or power consumption is to design a circuit to be able to operate in a stand-by or sleep mode, in which no load is active, which may for instance mean that reduced current or power consumption is achieved by reducing functionality. Some types of electronic devices can include subsets of circuit components which may independently be powered down. For instance, a memory circuit can be "volatile" or "non-volatile", with reference to whether it holds stored data through a power-down and power-up. Memory circuits can also support a stand-by mode, in which power is reduced. For instance, if a memory device includes circuitry for storing a data bit and circuitry for facilitating reading and writing, the stand-by mode can include powering down the latter, but not the former. Thus, volatile data is not lost.

Many semiconductor memory devices employ MOS technology. When such a device is in stand-by mode, it may nonetheless consume current or power, due to factors relating to the fabrication of the components, rather than to the powered-up operation of the circuit components. Here are some examples of this latter type of power consumption: A portion of the consumed power is attributable to leakage current across reverse-biased junctions. Another portion of the consumed power is attributable to bulk current (herein also called bulk leakage current), which flows between the substrate of the semiconductor device, and its fabricated components. Yet another portion is attributable to subthreshold current (herein also called subthreshold leakage current) flowing between the source and the drain of a MOS transistor when the MOS transistor is off. Herein, these types of current or power consumption, and other comparable types of current or power consumption which can be characterized as being due to factors relating to fabrication of the components, will be referred to generically as "power consumption due to factors relating to fabrication".

Therefore, it is desirable to reduce the power consumption due to factors relating to fabrication of semiconductor devices, for instance reducing the leakage for SRAM circuitry in standby mode. Such reduction is desirable, especially, for devices related to mobile and biomedical applications, which operate on battery power, or otherwise without an external power source.

Example Conventional Circuit

FIG. 1 is a schematic diagram of a conventional MOS memory cell. Power supply voltages VDDA and VSS are provided. Two pairs of MOS transistors are coupled in series between the two power supply voltages. A first pair forms a pathway through transistors 102 and 110. A gate voltage 106 is provided to drive the transistors 102 and 110 on or off. A second pair forms a pathway through transistors 104 and 108. A gate voltage 112 is provided to drive the transistors 104 and 108 on or off.

The gate voltage 106 is the voltage at the source-drain connection point between the transistors 104 and 108. Similarly, the gate voltage 112 is the voltage at the source-drain connection point between the transistors 102 and 110. As a consequence, such components form a well-known bistable memory cell circuit, which has a bit state of either 1 or 0, depending on the respective gate voltages at the points 112 and 106. The bit state can be read, or changed, by accessing the cell from a cell access signal bus 114 through a cell select transistor 116, and from a cell access signal bus 118 through a cell select transistor 120. The cell select transistors 120 and 116 are controlled by gate voltages, respectively shown as 122 and 124.

In a standby mode of operation, for instance a mode in which the memory cell of FIG. 1 is powered down, the memory cell draws current in a manner which will now be described. The logic states of the various labeled points in the diagram of FIG. 1 are as follows. The gate voltages 112 and 106 are at logic 0 and logic 1 states, respectively. The gate voltage 122 and 124 at both of the cell select transistors 120 and 116 is logic 0, indicating that, in stand-by mode, the cell is not being accessed. Two bitlines are shown as 118 and 114. In standby mode, they are at logic 0. Such logic values result, due to shutting down periphery of memory.

FIG. 1 also shows dotted-line arrows representing various leakage currents that are flowing in the above-described stand-by state. In this standby mode, subthreshold leakage current flows through the transistors 102 and 104, but not through the transistors 108 and 110. This will be understood, because of the respective high-true and low-true gates of such transistors, and because of the logic values of respective gates, as described above. Also, subthreshold leakage current flows through the cell select transistor 116, because of the different drain and source logic values.

Additionally, bulk leakage current flows between the substrate and the illustrated schematic components, as generally shown by the diagonal, downward-sloping arrow to the right of the transistor 120 in the schematic diagram of FIG. 1. While this arrow is given for illustrative purposes, it does not represent any limitations on how or where the bulk leakage current flows. Rather, it may be generally stated that such bulk current is related to the physical size and dimensions of the integrated circuit, as fabricated on the substrate.

It will thus be seen that the memory cell of FIG. 1, when operating in standby mode, draws current in a considerable number of forms. As a consequence, standby mode power consumption is a significant operating concern.

Example Embodiment

To reduce memory chip leakage current consumed in standby mode, the subthreshold and bulk current are both reduced, for the memory cells making up the array of storage cells in a semiconductor memory device.

FIG. 2 is a schematic diagram illustrating such a semiconductor memory cell, in accordance with one embodiment. The transistors making up the bistable memory cell are generally as shown in FIG. 1, as are the transistors coupling the bistable memory cell to the cell access signal busses.

Note that some of the transistors of FIG. 2 are enhancement mode transistors, having bulk terminals as well as drain, gate and source. This will be discussed in more detail below.

Storage cell array power switches, here shown as transistors 226 and 228, are shown, coupling the bistable memory cell to respective drain and source power voltages. The source and bulk terminal of the storage cell array power switch 226 is connected to the main power supply of memory, that power supply being designated VDD.

The storage cell array power switch 226, which is coupled in series between the drain power source VDD and operational circuitry of the memory cell, for instance here shown as bistable transistors 202 and 208, is controlled by a standby mode enable signal, for instance by a signal supplied as a gate input signal 230. When the standby mode enable signal 230 is in a logic "true" or "1" state, for example being high, the storage cell array power switch 226 is switched off. This causes the source and bulk terminals of the transistors 202 and 208 to go to logic "0".

In this example, the transistor 226 has a low-true gate. Thus, when the gate input signal 230 is logic 1, the transistor 226 is turned off, effectively decoupling the bistable memory cell from source power. The decoupled sources of the transistors 202 and 208 float to a value of logic 0, or slightly thereabove, as shown by the value 0+. Leakage current, shown as a dotted-line arrow across the transistor 226, causes the transistors 202 and 208 to float thusly, in effect precharging them.

Note, additionally, that in the embodiment the transistor 226 is shown as an enhancement mode device. The bulk (also called "body" or "substrate") connection is coupled to the power source. If the power source is taken as logic 1, then the transistor 226, which has a low-true gate as noted above, is again turned off because of the logic 1 body voltage.

The storage cell array power switch transistor 228, which is coupled between the common (ground) power source and the sources of the bistable transistors 210 and 204, is controlled, for instance by a gate input signal 232. In this example, the transistor 228 has a logic high-true gate. Thus, when the gate input signal 232 is logic 0, the transistor 228 is turned off, effectively decoupling the bistable memory cell from ground.

In the illustrated embodiment, the bistable transistors 202 and 208 are shown as enhancement mode MOS transistors. The body connections are coupled to the drains, and thus are at the floating 0+ voltage discussed above.

Standby Mode Operation

From the foregoing discussion, it will be seen that the memory cell of FIG. 2 can be placed in a standby mode by applying the gate input signals 230 and 232 to logic 1 and 0 values, respectively, to turn off the respective storage cell array power switch transistors 226 and 228, thereby decoupling the memory cell from power and ground. Power consumption is of course reduced by turning off power to the circuitry, but in addition, the power consumption due to factors relating to fabrication is reduced, as can be seen by comparing FIG. 2 with FIG. 1, and noting the dotted-line arrows representing the various currents. This reduction in the power consumption due to factors relating to fabrication will now be discussed.

In standby mode, the logic values of other signals given in the schematic diagram of FIG. 2 will now be set forth. As noted above, in standby mode the gate input signals 230 and 232 are respectively logic 1 and logic 0, to turn off the switches 226 and 228, thereby decoupling the bistable cell from power and ground.

Bistable circuit gate values 212 and 206 are logic 0. While the gates of the transistors 202 and 208 are logic low-true, the drain, body and source are all essentially at the same logic 0 voltage, so the transistors 202 and 208 are off. Similarly, the gates, drains, and sources of the transistors 210 and 204 do not have voltages that would cause the transistors to draw current. Because the transistors 202 and 208 are off, the current is restricted from flowing, by contrast with the case in the circuit of FIG. 1.

Cell select transistors 220 and 216 are also turned off, since corresponding gate voltages 222 and 224 are at logic 0. Also, the voltages 218 and 214 are logic 0. Since the cell select transistor 216 is off, due to the logic 0 at all three of its terminals, the current is restricted from flowing, by contrast with the case in the circuit of FIG. 1.

Finally, the bulk leakage current shown and described with reference to FIG. 1 is also restricted from flowing, to the extent that portions of the operational circuitry (for example, the memory circuit) are decoupled from power.

The standby mode current consumption of the embodiment of FIG. 2, may thus be compared with the current consumption of the prior art circuit of FIG. 1. Because power is decoupled from the bistable memory cell, much of the current that flowed in the components of the circuit of FIG. 1, when it is operating in standby mode, is saved.

Examples of Fabrication of Embodiments

The above discussion describes, in terms of schematic elements of the circuit of FIG. 2, how the current flow is reduced, relative to that of the circuit of FIG. 1. In terms of the fabrication of the semiconductor elements making up the circuit, the bulk leakage current is reduced, for PMOS devices, by decoupling the substrate from the power supply. Such decoupling may be realized, for instance, by adding an intermediate switch, for example the switch transistors of FIG. 2, in the fabrication between the device substrate and the power supply.

The source and bulk terminal of the storage cell array power switch, for instance 226, is connected to the main power supply of memory. The gate of this power switch is connected to a standby mode enable signal. The drain of power switch is connected to source and bulk terminal of all PMOS devices of storage cell array. When standby mode enable signal is high, the storage cell array power switch is switched off, which causes the source and bulk terminal to go to logic "0". Therefore, ideally subthreshold and bulk current is zero in storage array.

In one embodiment, the fabrication process includes the formation of the semiconductor structure known as a "deep n-well". For instance, in a memory device as described above, one Deep NWELL for may be used for each storage cell device of the array, and other Deep NWELLs may be used for logic devices. "Deep n-well" refers to the structure produced by a fabrication process to produce an n-well, preceded by a high energy ion implantation step.

The deep n-well in a memory cell is used for decoupling the power supply from the bulk terminal of a MOS transistor in a storage cell array device. A separate deep n-well is also employed for logic devices within an SoC device or other device including architecture other than merely a memory array. In such a device where the memory array is integrated with other logic, the bulk supply of the logic devices in standby mode also affords an opportunity for savings in current consumption.

For an embodiment whose schematic architecture is generally as given in FIG. 2, when power is switched off for the cells of a memory array, source and bulk terminals of the devices go to logic 0. Accordingly, subthreshold and bulk current are reduced to near zero.

FIG. 3 is a cross-sectional illustration of a portion of a circuit, for example that of FIG. 2. The left side of the diagram (generally shown as a power switch region 302) shows fabrication of a power switch, for example the transistor 226 of FIG. 2. The right side of the diagram is a power shutdown region (generally shown as 304) which shows a portion 308 of the bistable memory cell, i.e., part of the memory array with well taps, for instance the devices 202 and 210. A substrate 306 is shown.

The power switch 302 has a well such as a deep n-well (DNW), here shown as a DNW 310. Formed adjacent to the deep n-well DNW 310 are three shallower n-wells 312, 314, and 316, which support the gate, drain, source, and body contacts of the power switch 226 as shown in its schematic representation in FIG. 2. VDD power is provided to the source 318 of the power switch, and to the body contact 320. The gate 322 receives the switch enable signal, which is shown here as a signal EN 324, for enhancing the drain-source channel to enable current flow. The circuit element 326 is shown as coupling the drain 328 of the power switch 302 to the circuit portion 304. The element 326 is designated VDDA, to represent that it provides what is, in effect, a supply voltage to the power shutdown region 304, wherein the supply voltage VDDA can be shut off based on the operational state of the power switch region 302. Likewise, in FIG. 2 VDDA is shown as a node, wherein the switch 226 is between the power supply voltage VDD and the node VDDA, so that power from VDD to VDDA is coupled or decoupled based on operation of the switch transistor 226 as described herein.

The power shutdown region 304 includes the enhancement mode FET 202 of FIG. 2, as noted above. The FET 202 is formed over a deep n-well (DNW) 330.

The VDDA circuit element 326, just referred to, is coupled to the source and body contacts of the FET 202, the contacts being shown respectively as 332 and 334. A signal line A, shown here as 336, is coupled to the drain 338 of the FET 202. A signal line X, shown here as 340, is coupled to the gate 342 of the transistor 202.

The FET 210 is also formed on the same deep n-well 330 as the FET 202. Its gate 346 is also coupled to the signal line X 340, as shown both here and in the schematic diagram of FIG. 2. Its drain 344 is coupled to the signal line A 336, to couple with the drain 338 of the transistor 202, which again is as shown in FIG. 2. The source 348 is shown as coupled to a signal line VSS 350, which represents the coupling, through the transistor 228, to VSS as shown in FIG. 2.

FIG. 3 additionally shows regions which reflect the operation of the circuit of FIG. 2. The power switch transistor 226 of FIG. 2 is designated by a dashed line 352, representing a Power gate, and which is a portion of the power switch region 302. As this power switch operates to cut off power in standby mode, the region of circuitry 304 for which power is shut down is designated by a solid line. VDD power reaches the substrate 306 through the source 318 of the power switch 302, the n-wells 312 and 314, and the deep n-well 310. Accordingly, operation of the power switch transistor 302 also controls the power from VDD reaching the substrate 306.

Example Test Results

In general, the percent power savings for a semiconductor device incorporating an embodiment of the present disclosure for decoupling power from memory cells in standby mode will be related to the amount of memory in the device, relative to the total size of the device. Sub-threshold and bulk currents may both be reduced significantly, by introducing power switches for example those of FIG. 2 described above, for the entire storage cell array of a semiconductor device incorporating memory.

The same power switches were used for disconnecting the n-well supply of PMOS to achieve bulk current reduction. Where the power supply is decoupled from the source and bulk terminals of storage cell array PMOS devices, leakage current is reduced, close to zero. Therefore, in a device where the memory storage array constitutes a major part of the overall device, significant leakage reduction and power savings are achieved.

Simulation results have been obtained for a memory device (>500 MB), where the storage cell array is large, as compared with the accompanying logic devices. The simulation results for a 1.1V device, operating at 25C, and including a memory array of 256 rows by 32 columns, show that leakage current attributable to the memory array may be reduced from 107 nA to 27 pA.

Devices and Equipment that Include Embodiments

Various types of devices and equipment, including operational circuitry requiring power for operation, can include embodiments. Embodiments may be used in devices and equipment which operate in a stand-alone, wherein they have no external power source, but rather rely on on-board power sources for example batteries, mechanical power generation devices, photocells capturing ambient radiation for power generation, etc. Such embodiments can include handheld equipment, for example test and measurement equipment, diagnostic equipment, computer equipment, communication equipment for example cellular telephones and radio transceivers, game stations, media playback equipment for music and video, and other types of mobile handheld equipment. More broadly, any type of equipment might employ embodiments for power savings.

Also, while the embodiment of FIG. 2 shows a memory circuit having an embodiment for standby mode power savings, other types of circuits may also employ similar circuitry for power savings. Various types of circuits and devices might have standards for when power saving may be employed which differ from the standby mode of semiconductor memories. For instance, they might have timeout conditions, under which inactivity for a predetermined time might involve shifting into a power save mode. Also, such devices might have a log-in procedure or other user access protocol; when no user is accessing, a power save mode might be achieved.

Although the disclosed embodiments have been described in detail with reference to particular elements and features, persons possessing ordinary skill in the art will appreciate that various modifications and enhancements may be made without departing from the spirit and scope of the claims that follow.

What is claimed is:

1. An electronic device comprising a semiconductor memory cell, the semiconductor memory cell comprising:
   a substrate;
   a memory cell circuitry on the substrate, the memory cell circuitry comprising:
      a well fabricated in the substrate, wherein a current path from a power source to the substrate runs through the well; and
      a junction device comprising a junction configured to be forward biased or reverse biased, wherein a reverse bias leakage current flows across the junction when the junction is reverse biased; and
   a switch coupled between the memory cell circuitry and a power source, wherein the switch is in series with the current path between the power source and the substrate, the switch configured to decouple the memory cell circuitry from the power source during a standby mode,
   whereby, in the standby mode, a current is restricted from flowing from the power source through the well to the substrate, and the reverse bias leakage current is restricted from flowing through the junction device.

2. The electronic device as recited in claim 1, wherein the substrate includes a PMOS substrate.

3. The electronic device as recited in claim 1, wherein the switch comprises a MOS transistor.

4. The electronic device as recited in claim 3, wherein the MOS transistor is an enhancement mode MOS transistor having a bulk terminal coupled to the power source.

5. The electronic device as recited in claim 3, wherein the well includes a deep n-well, and the MOS transistor is fabricated to have a structure including the deep n-well.

6. The electronic device as recited in claim 5, wherein the switch further comprises shallow n-wells which support a gate contact, a drain contact, a source contact, and a body contact of the switch.

7. An electronic device comprising a semiconductor memory cell, the memory cell comprising:
   a bistable bit storage circuit having a first power contact point and a second power contact point;
   a first switch coupled to the first power contact point to receive a first voltage;
   a second switch coupled to the second power contact point to receive a second voltage; and
   a circuitry for turning off the first and second switches to decouple the respective first and second voltages from the respective first and second power contact points, during a standby operation of the electronic device.

8. The electronic device as recited in claim 7, wherein the first and second switches include, respectively, first and second MOS transistors.

9. The electronic device as recited in claim 8, wherein the first MOS transistor is an enhancement mode transistor having a bulk terminal coupled to receive the first voltage.

10. The electronic device as recited in claim 8, wherein the MOS transistors are each fabricated to have a structure including a deep n-well.

11. An electronic apparatus comprising:
    an on-board power source;
    an operational circuitry including a substrate and a semiconductor device operable to have a power consumption due to factors relating to fabrication, wherein the power consumption due to factors relating to fabrication includes a reverse bias leakage current flowing across a junction device of the semiconductor device when the junction device is reverse biased, and a current flowing from the on-board power source through the semiconductor device to the substrate; and
    a circuitry for switchably coupling and decoupling the on-board power source to the operational circuitry, such that the power consumption due to factors relating to fabrication is reduced when the on-board power source is decoupled from the operational circuitry during a standby mode of the operational circuitry.

12. The electronic apparatus as recited in claim 11, wherein:
    the operational circuitry operates in first and second modes, the second mode being the standby mode; and
    the circuitry for switchably coupling operates to couple the on-board power source to the operational circuitry in the first mode, and to decouple the on-board power source from the operational circuitry in the second mode.

13. The electronic apparatus as recited in claim 11, wherein the on-board power source comprises a battery.

14. The electronic apparatus as recited in claim 11, wherein:
    the operational circuitry includes MOS technology having, in operation, one of leakage current, bulk current, and sub threshold current; and
    when the circuitry for switchably coupling decouples the on-board power source from the operational circuitry, one of the leakage current, the bulk current, and the sub threshold current is reduced.

15. The electronic apparatus as recited in claim 11, wherein the operational circuitry includes a memory circuit.

16. The electronic apparatus as recited in claim 12, wherein the operational circuitry includes a memory circuit, the memory circuit including:
- a bistable bit storage circuit having a first power contact point and a second power contact point;
- a first switch coupled to the first power contact point to receive a first voltage;
- a second switch coupled to the second power contact point to receive a second voltage; and
- a circuitry for turning off the first and second switches to decouple the respective first and second voltages from the respective first and second power contact points, during the standby mode of the operational circuitry.

17. The electronic apparatus as recited in claim 16, wherein the first and second switches include, respectively, first and second MOS transistors.

18. The electronic apparatus as recited in claim 17, wherein the first MOS transistor is an enhancement mode transistor having a bulk terminal coupled to receive the first voltage.

19. The electronic apparatus as recited in claim 17, wherein the first and second MOS transistors are each fabricated to have a structure including a deep n-well.

* * * * *